(12) United States Patent
Pascucci

(10) Patent No.: US 6,594,180 B2
(45) Date of Patent: Jul. 15, 2003

(54) SEMICONDUCTOR MEMORY SYSTEM

(75) Inventor: Luigi Pascucci, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/158,554

(22) Filed: May 30, 2002

(65) Prior Publication Data

US 2002/0196662 A1 Dec. 26, 2002

(30) Foreign Application Priority Data

May 30, 2001 (EP) .............................. 01830345

(51) Int. Cl.[7] .......................... G11C 5/02; G11C 11/419
(52) U.S. Cl. ........................... 365/185.18; 365/185.25; 365/189.01; 365/204; 365/207; 365/51
(58) Field of Search ....................... 365/185.01, 185.25, 365/189.01, 51, 204, 207

(56) References Cited

U.S. PATENT DOCUMENTS

| | | | |
|---|---|---|---|
| 5,448,518 A | 9/1995 | Jinbo | ........................ 365/185 |
| 6,181,597 B1 | 1/2001 | Nachumvosky | ............. 365/185 |

FOREIGN PATENT DOCUMENTS

| | | |
|---|---|---|
| EP | 0 791 936 | 8/1997 |
| GB | 2 272 089 | 5/1994 |

OTHER PUBLICATIONS

Abstract of the 1996 International Conference on Solid State Devices and Materials, Yokohama, 1996, pp. 269–271 entitled "A Novel NOR Virtual–Ground Array Architecture for High Density Flash"; XP 000694045.

Tsao et al.: "A 5V–Only 16M Flash Memory Using A Contactless Array of Source–side Injection Cells", 1995 Symposium on VLSI Circuits, Kyoto, Jun. 8–10; pp. 77–78. XP000557809.

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

A memory system includes a memory matrix formed on a semiconductor structure. The memory matrix includes a first column line and a second column line which are connected electrically to at least one first memory cell to be read. For the reading of the at least one first cell, a first reading voltage can be supplied to the first column line. The memory matrix also includes a third column line distinct from the first column line and from the second column line. The memory matrix further includes generating circuit for supplying, to the third column line and during the reading of the at least one first memory cell, a biasing voltage which can oppose the establishment of an electric current between the first column line and the third column line in the semiconductor structure. The biasing voltage is preferably substantially equal to the first reading voltage.

44 Claims, 6 Drawing Sheets

FIG. 4

Legend: S → VBL, B → V-Bias, G → GND, F → Float

| | BL-0 | BL-1 | BL-2 | BL-3 | BL-4 | BL-5 | BL-6 | BL-7 |
|---|---|---|---|---|---|---|---|---|
| Up_L & Dw_L | | B | S | G | F | | | |
| Up_L & Dw_R | | G | S | B | F | | | |
| Up_R & Dw_L | | B | S | G | B | B | | |
| Up_R & Dw_R | | | S | G | F | | | |
| Up_L & Dw_L | | F | G | S | B | | | |
| Up_L & Dw_R | B | F | B | S | G | | | |
| Up_R & Dw_L | | B | G | S | | | | |
| Up_R & Dw_R | | F | G | S | B → | | | |
| Up_L & Dw_L | | | | B | S | G | F | |
| Up_L & Dw_R | | | | G | S | B | F | |
| Up_R & Dw_L | | | | B | S | G | B | |
| Up_R & Dw_R | | | | | S | G | F | |
| Up_L & Dw_L | | | | F | G | S | B | |
| Up_L & Dw_R | | | B | F | B | S | B | |
| Up_R & Dw_L | | | | B | G | S | G | |
| Up_R & Dw_R | | | | F | G | S | B | |

SEMICONDUCTOR MEMORY SYSTEM

FIELD OF THE INVENTION

The present invention relates to a semiconductor memory system, and more particularly to a non-volatile memory.

BACKGROUND OF THE INVENTION

Conventionally, a type of memory-cell matrix which has a so-called "NOR" or "double-T" structure is used for non-volatile semiconductor memories. In a matrix of this type, the rows or word lines of the matrix which, typically, include polysilicon strips that form the control gates of the cells belonging to these rows, extend parallel to one another in a first direction. Doped regions, for example, n-type doped regions, are formed between alternate pairs of rows and extend parallel to the rows, throughout the length of the rows; each of the diffused regions forms a common source line for the memory cells that belong to the pair of rows between which the doped region is formed. The drains of the cells are formed of n-type doped regions aligned parallel to the rows and formed between alternate pairs of rows, other than those between which the source lines are formed. The columns or bit lines of the matrix include metal lines, typically made of aluminium, which extend parallel to one another in a direction perpendicular to the rows, and which contact the drains.

To select a generic memory cell, the row to which the cell belongs is selected by bringing it to a preselected potential and the column to which the cell belongs is connected electrically to a reading circuit. Typically, the reading circuit performs a reading of the cell via a current. In memories which adopt the above-mentioned type of cell matrix, reading of the memory cells with a current is easy to implement and, for this reason, is widely adopted. The generic memory cell selected is in fact safely insulated from the memory cells adjacent thereto.

Contactless memory structures, which have alternative architectural characteristics to those described above, are also known and enable the overall area occupied by a memory matrix to be reduced. In a contactless memory matrix, n-type doped regions are provided and extend, parallel to one another, in the direction perpendicular to the rows. These regions represent the bit lines of the memory matrix and act alternately as drain and source electrodes for the memory cells to which they are connected.

In these memory matrices, the memory cells include and are delimited by diffusions which extend from the source regions to the drain regions, parallel to the rows, and which partially coincide with the bit lines. The gate terminal of each memory cell is formed by the portion of polysilicon connecting each source diffusion to that of the drain, and can be formed by floating-gate technology, which uses a double polysilicon layer, or by an NROM (nitride read-only memory) technology, using a layer of nitride, or even simply of oxide, that is, with standard MOS technology.

In a contactless matrix, the memory cells are clearly separated by the interposition of suitable insulation regions, but appear contiguous with one another. Moreover, for particular memory cells, contactless matrixes can use a virtual-ground type of architecture. This means that a particular bit line does not have a univocal role but may operate as a source electrode during a first reading or writing operation, whereas it may operate as a drain electrode during a further reading or writing operation.

The ability to use the same bit line as a source or drain electrode, for example, enables reading operations to be performed on memory cells disposed on both sides of the same bit line. Virtual-ground architecture is particularly suitable for memory cells such as, for example, NROM cells, which are read in the opposite direction to that in which they are programmed. In particular, it is known that virtual-ground architecture may advantageously be used for "dual-bit" NROM memory cells which enable one bit to be stored for each side of the cell.

In spite of the advantages offered, contactless and virtual-ground architectures have disadvantages caused by the contiguity of the memory cells and by the need to access a generic cell by non-univocal methods. Up to now, these disadvantages have rendered current reading inapplicable to these structures in practice, unless very low performance of the reading operation is accepted. In fact, the contiguity with which the cells are formed is the cause of a neighbor effect which is manifested by the development of undesired electric currents (leakage currents) between a memory cell which is being read and to which a suitable voltage is applied, and one or more contiguous cells. These leakage currents are not constant but depend on the states (virgin or programmed) of the cells contiguous to those being read.

The presence of leakage currents degrades the current affecting the cell being read, reducing the performance of the operation. Moreover, the fact that the role of each bit line is not univocal in virtual-ground structures complicates the production of circuits which control the methods of access to a cell of the memory matrix. This difficulty is further increased when dual-bit cells are used.

For these reasons, conventional reading with current is replaced, for example, by techniques which use a dynamic approach. The dynamic approach is based on an analysis of the capacitive behaviour of the cell being read and of that of a reference cell. These techniques are particularly complex and expensive and, above all, are not immune to the above-mentioned neighbor effects.

SUMMARY OF THE INVENTION

An object of the present invention is to provide a memory system in which the above-described leakage-current phenomenon is avoided so that it is possible to implement an advantageous reading of the memory cells with current.

The object of the present invention is achieved by a memory system including a memory matrix formed on a semiconductor structure. The memory matrix includes a first column line and a second column line which are connected electrically to at least one first memory cell to be read. For the reading of the at least one first cell, a first reading voltage can be supplied to the first column line. The memory matrix also includes a third column line distinct from the first column line and from the second column line. The memory matrix further includes generating circuit for supplying, to the third column line and during the reading of the at least one first memory cell, a biasing voltage which can oppose the establishment of an electric current between the first column line and the third column line in the semiconductor structure. The biasing voltage is preferably substantially equal to the first reading voltage.

BRIEF DESCRIPTION OF THE DRAWINGS

For a better understanding of the invention, a non-limiting embodiment thereof is described below and is illustrated in the appended drawings, in which:

FIG. 4 is a table which illustrates the operation of the memory system of FIG. 3;

DETAILED DESCRIPTION OF THE PREFERRED EMBODIMENTS

Figure 1:
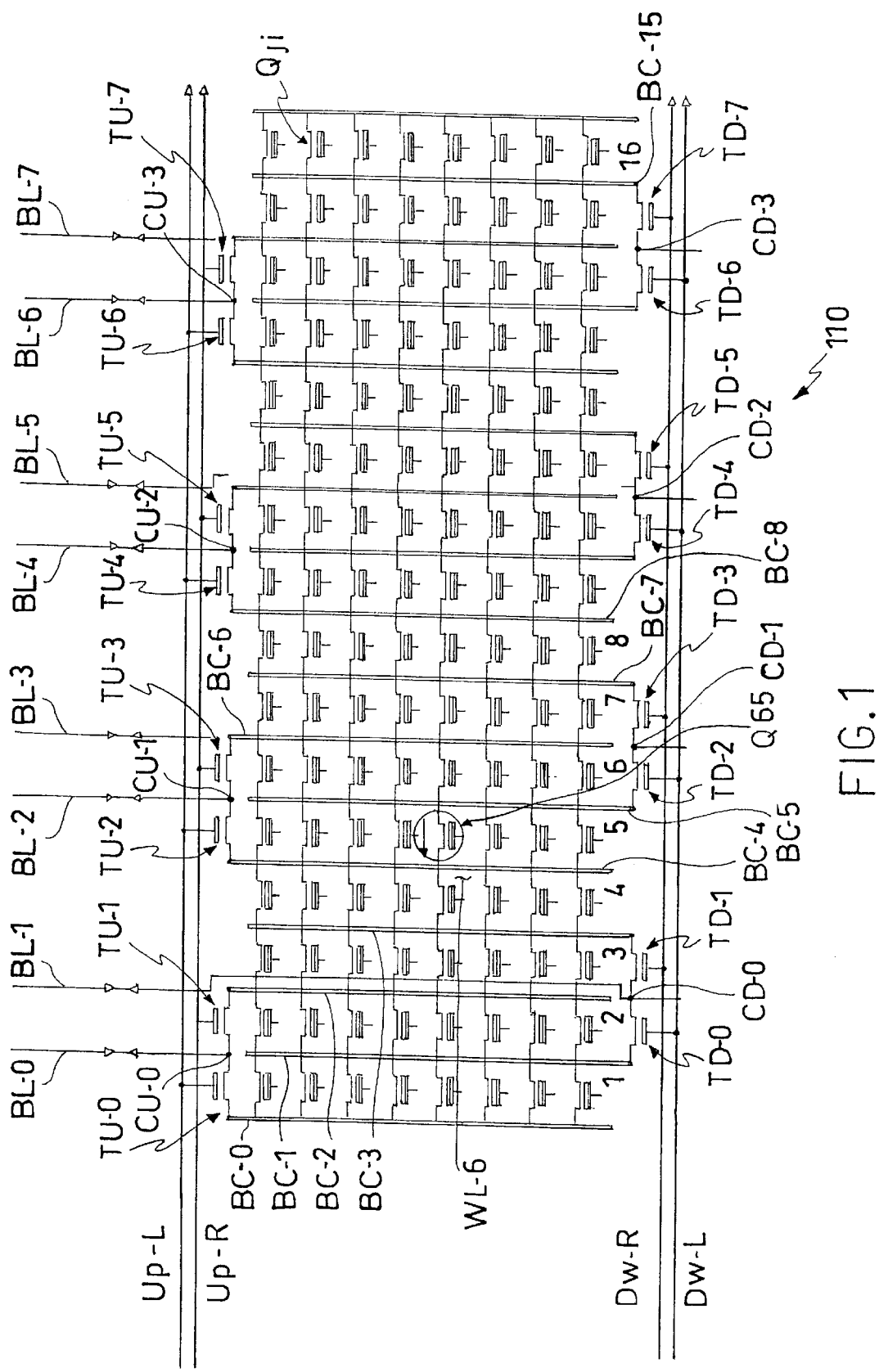
FIG. 1 is a schematic diagram of a memory matrix in accordance with the present invention.

FIG. 1 shows, schematically, a memory matrix or array 110 comprising a plurality of memory cells Qji arranged in rows and columns. In particular, for the cell Qji, the index "j" and the index "i" indicate, respectively, the number of the row and of the column in which the specific memory cell is disposed. The memory cells Qji may be semiconductor memory cells of any conventional type such as, for example, ROM, EPROM, EEPROM or Flash-EEPROM cells.

Typically, the memory array 110 is formed on a semiconductor structure and, for example, by a conventional contactless technique. Moreover, the architecture of the memory array 110 shown in FIG. 1 may be of the virtual-ground type. In the memory array 110, each memory cell Qji has its gate terminal connected to a word line WL-j. For simplicity of representation, only a portion of the word line WL-6 which joins the gates of the cells of the sixth row is drawn in FIG. 1.

The memory array 110 also has a plurality of column lines, hereinafter referred to as cell bit lines BC-0, BC-1, BC-2, . . . BC-i, . . . BC-N, for example, formed by a plurality of parallel diffusions which extend in the direction of the columns of the array 110. Each memory cell Qji is connected, by respective terminals, (for example, its source and drain terminals) to two successive cell bit lines BC-i-1 and BC-i. For example, the memory cell Q33 is connected to the bit line BC-2 and to the subsequent bit line BC-3. All of the cells Qi3 disposed along the same column are connected in the same manner.

The memory array 110 also comprises a plurality of reading lines (for example, made of metal) or, more briefly, bit lines BL-0, BL-1, BL-i, BL-N/2-1 which are divided, on the basis of the parity of the index i, into even bit lines BL-2i and odd bit lines BL-2i+1. As will become clearer from the following description, these bit lines BL-i enable the cell bit lines BC-i to be connected electrically to an external reading circuit (not shown in FIG. 1). In particular, each bit line BL-i of even or odd index can be connected to the cell bit line BC-i closest to it and having the same parity. In greater detail, each even bit line such as, for example, the bit line BL-0, is connected to a respective upper electrical contact CU-i, such as the contact CU-0 (represented schematically by a node) and each odd bit line such as, for example, the bit line BL-1, is connected to a lower electrical contact CD-i, such as the contact CD-0.

In FIG. 1, for clarity of representation, the odd bit lines BL-i which are to be connected to the respective lower electrical contacts CD-i-1 are shown only partially. The only odd bit line which is shown as a whole is the odd bit line BL-1 which reaches the lower contact CD-0. The memory array 110 also has a plurality of upper selection transistors TU-0, TU-1, TU-i, . . . , TU-7 and a plurality of lower selection transistors TD-0, TD-1, TD-i, TD-7. For example, these upper and lower selection transistors may be formed by n-channel MOSFETs. Each selection transistor TU-i or TD-i can be activated for conduction by the application of a suitable signal to its gate terminal. Moreover, the source and drain terminals of each upper selection transistor TU-i are connected, respectively, to a cell bit line of even index and to an upper electrical contact.

In the embodiment of FIG. 1, the upper selection transistor TU-0 connects the bit line BL-0 to the cell bit line BC-0, via the upper contact CU-0, and the upper selection transistor TU-1 enables the bit line BL-0 to be connected to the cell bit line BC-2, via the upper contact CU-0. Similarly, the source and drain terminals of each lower selection transistor TD-i are connected, respectively, to a cell bit line of odd index and to a lower electrical contact. In the embodiment of FIG. 1, the lower selection transistor TD-0 enables the bit line BL-1 to be connected to the cell bit line BC-1, via the lower contact CD-0 and the lower selection transistor TD-1 enables the bit line BL-1 to be connected to the cell bit line BC-3, via the lower contact CD-0.

The upper selection transistors TU-i can be activated for conduction (and/or deactivated) via an upper left-hand selection line Up-L and an upper right-hand selection line Up-R which are connected to the gate terminals of the transistors. In particular, the upper selection transistors TU-i having even indices can be activated by the upper left-hand selection line Up-L and the upper selection transistors TU-i having odd indices can be activated by the upper right-hand selection line Up-R. Similarly, the lower selection transistors TD-i having even indices can be activated by a lower left-hand selection line Dw-L and the lower selection transistors TD-i having odd indices can be activated by a lower right-hand selection line Dw-R.

As will be described in greater detail below, each memory cell Qji is accessed by the simultaneous activation of an upper selection transistor and a lower selection transistor. For example, in the case of single-bit memory cells, to access the memory cell Q33, the word line corresponding to the third row must be activated and current must be brought to the cell bit line BC-2 and to the cell bit line BC-3. This access takes place by the activation of the upper right-hand selection line Up-R and of the lower right-hand selection line Dw-R, with consequent activation of the transistors TU-1 and TD-1 which connect the bit line BL-0 to the cell bit line BC-2 and the bit line BL-1 to the cell bit line BC-3, respectively.

With reference to EEPROM, EPROM or Flash-EPROM memory cells, it is assumed that each memory cell has its source terminal connected to a cell bit line BC-i of even index and its drain terminal connected to the next cell bit line BC-i+1, which thus has an odd index. In this case, to read, program (if the cell is programmable), or erase (if the cell is electrically erasable) each cell, a suitable voltage is supplied to the corresponding cell bit line BC-i of even index which is connected to the source of the cell in question and a further voltage is supplied to the cell bit line of odd index BC-i+1 which is connected to the drain terminal of the cell.

However, in the case of NROM cells which, as is known, are read in the opposite direction to that in which they are programmed, the cell bit line of even index will receive the source voltage during a cell-reading step and the drain voltage during a cell-programming step. In other words, for NROM memory cells, each cell bit line BC-i will adopt the role of a source terminal or of a drain terminal, according to the type of operation to be performed. It is pointed out that the architecture of the memory array 110 is particularly suitable for dual-bit NROM cells.

Figure 2:
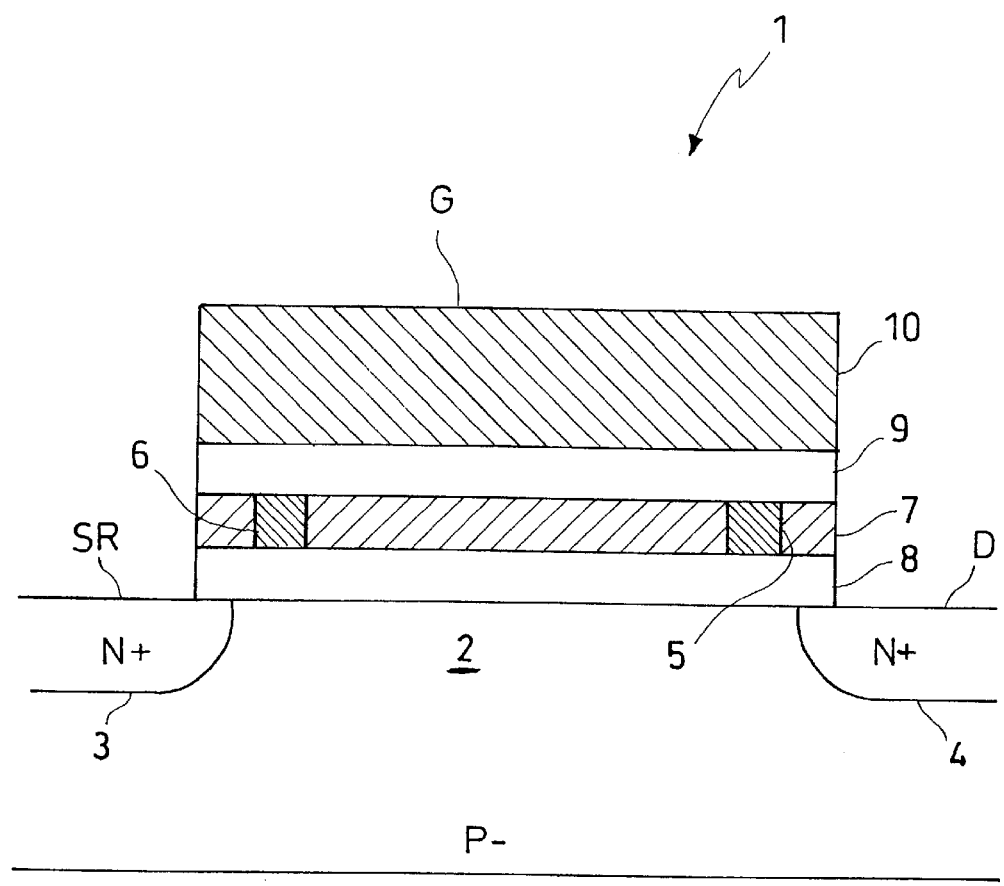
FIG. 2 is a schematic cross-sectional view of a dual-bit memory cell usable in the memory matrix of FIG. 1.

Dual-bit NROM cells have the characteristic of storing one bit for each side of the cell. A cell of this type is described in U.S. Pat. No. 6,011,725. For completeness of description, FIG. 2 shows schematically a dual-bit cell 1. The cell 1 has a single p⁻-type doped channel 2 disposed between two n⁺-type regions 3 and 4 which are intended, within the array 110 of FIG. 1, to be connected, respectively, to two cell bit lines. The cell 1 also comprises two areas 5 and 6, each of which can store an electric charge independently of the other. Each of these areas 5 and 6 defines one bit. In the dual-bit cell 1, the areas 5 and 6 are within a nitride layer 7 interposed between a first oxide layer 8 and a second oxide layer 9 on which a polysilicon layer 10, corresponding to a gate terminal G, is disposed. To read a first bit disposed in the area 6, that is, a bit disposed on the left, the region 4 (connected to one cell bit line) represents a drain region D and the region 3 (connected to a further cell bit line) represents a source region SR. The cell 1 is such as to cause solely the charge stored in the area 6 to influence the current in the channel 2. To read a second bit stored in the area 5, that is, a right-hand bit, the cell is read in the opposite direction and the region 4 represents the source region and the region 3 represents the drain region.

A dual-bit memory cell $Q_{65}$, which is interposed between the cell bit lines BC-4 and BC-5 and circled in FIG. 1, is considered by way of example. To read the cell $Q_{65}$, the word line WL-6 will be brought to a suitable voltage (for example, within a range of approximately 3.8 V-4 V). Moreover, a situation is considered, in which the left-hand bit of the cell $Q_{65}$, which is analogous to that stored in the area 6 of the dual-bit cell 1 of FIG. 2, is to be read. To read this bit with the use of a conventional current-sensing reading technique, it is necessary to cause the cell bit line BC-4 to operate as a drain terminal. To achieve this, the cell bit line BC-4 will have to operate as a sense-line and will be brought to a reading or sensing voltage V-BL equal to that generated by a sensing structure commonly used in a reading circuit. Typically, the sensing voltage V-BL is within the range of approximately 1.6 V-2 V.

The bit line BL-2 will consequently be brought to the sensing voltage V-BL and the upper selection transistor TU-2 will be activated for conduction by the activation of the upper left-hand selection line Up-L. In particular, this upper left-hand selection line Up-L can be brought to a standard supply voltage Vcc of the chip on which the memory array 110 is formed. Moreover, the cell bit line BC-5 will be brought to a reference or ground voltage GND (for example, 0V) so as to operate as a source terminal. The bit line BL-3 will consequently be brought to the ground voltage GND and the lower selection transistor TD-2 will be activated for conduction by the activation of the lower left-hand selection line Dw-L.

Table 1 summarizes the selection lines which are activated in this particular example and, by the symbols S and G, the types of voltages to which the bit lines necessary for reading the left-hand bits of all of the cells of the column 5, such as the cell $Q_{65}$, are brought. In particular, the symbol S indicates that the bit line of the respective column adopts the role of a sense-line and is thus brought to a sensing voltage V-BL, whereas the symbol G indicates that the bit line of the respective column is brought to a ground voltage GND.

TABLE 1

| Selection lines activated | Bit lines activated | |
| --- | --- | --- |
| Up-L & Dw-L | BL-2 | BL-3 |
| | S | G |

S → V-BL
G → GND

In a reading condition such as that described above, the current in the cell $Q_{65}$ is directed in the direction shown by an arrow in FIG. 1.

It was mentioned above that, for a contactless memory array, the memory cells are contiguous, that is, they are not-separated by a suitable insulating region. It is pointed out that, in these contactless structures, the reading signal, that is, the current present at the drain terminal of the memory cell to be read, may be established not only in that cell but also in contiguous cells. In other words, leakage currents, possibly of a purely capacitive nature (since they lack resistive paths) may arise, due to the contiguity of the memory cells and of the cell bit lines. The leakage currents are more marked the longer is the sequence of adjacent virgin cells. These undesired phenomena are known as the neighbor effect.

Moreover, in the case of dual-bit cells, the need to enable each cell to be read in two different directions means that each current path is not univocal, rendering the formation of undesired paths for the reading current or sensing current even more likely. Because of these leakage currents, the reading current, from which information on the stored datum is to be derived, may be seriously degraded. Moreover, these currents do not have constant characteristics but are dependent on the states (virgin or programmed) of the memory cells adjacent that which is to be read.

When this degradation arises, it not only weakens the reading signal in the normal mode of operation of the memory, but may be a source of misdirections during the checking stages which may follow a programming or erasure operation. This degradation renders the use of current-sensing techniques for contactless memory arrays more critical and difficult, if not completely impracticable. In the particular example described with reference to FIG. 1, the current in the memory cell $Q_{65}$ may affect not only the cell $Q_{65}$ and the cell bit lines BC-4 and BC-5, but also cells which are in lower-order columns such as columns 4 to 1.

Figure 3:
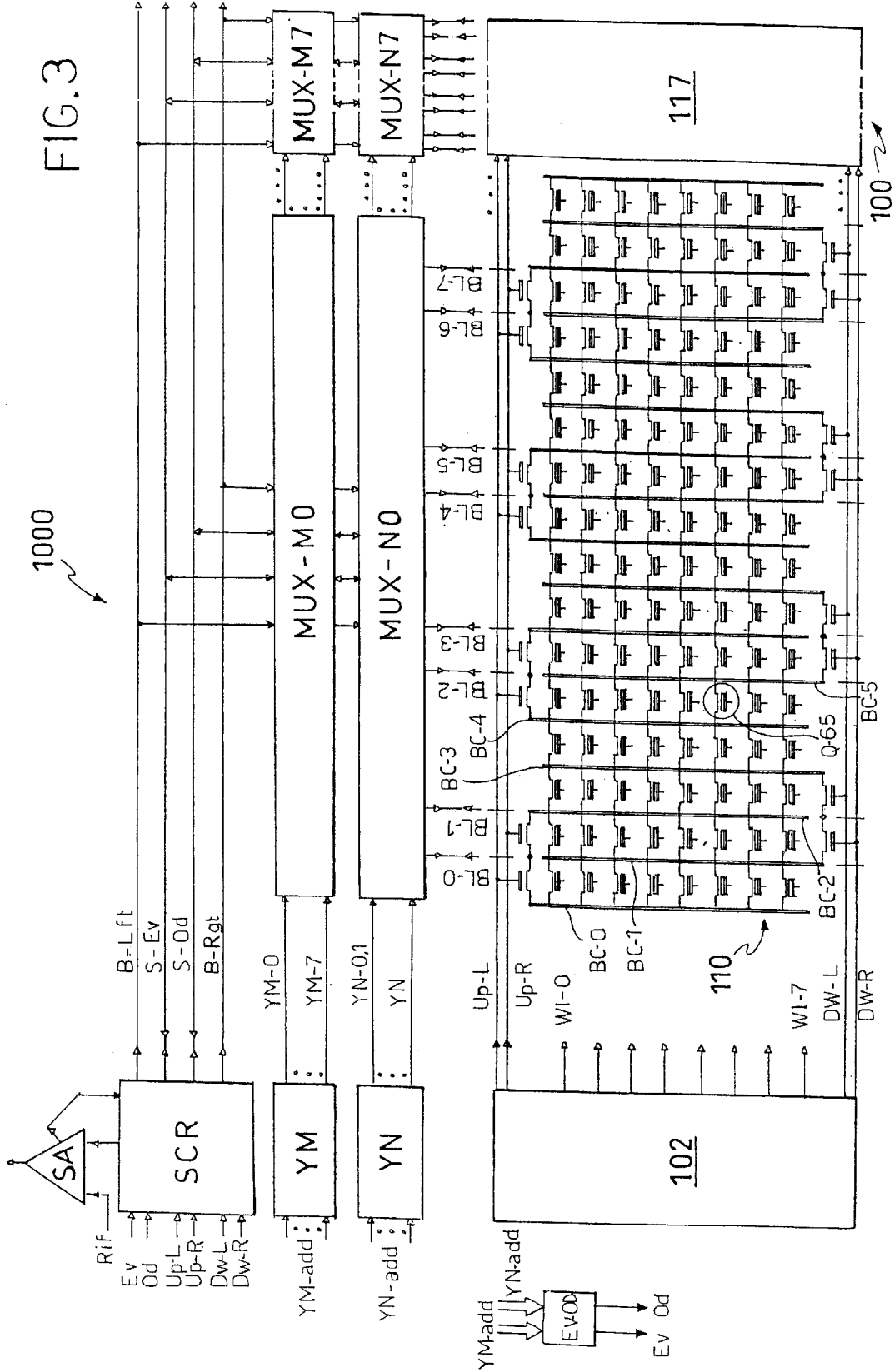
FIG. 3 is a schematic diagram of a memory system according to the invention including a memory matrix of FIG. 1.

FIG. 3 shows schematically a preferred embodiment of a memory system 1000 according to the invention. The memory system 1000 opposes or even eliminates the establishment of the above-mentioned leakage currents. The method by which the memory system 1000 operates provides, during the reading of a memory cell, for an isolating or biasing voltage V-Bias to be supplied to at least one cell bit line suitably contiguous to the cell bit line to which the sensing voltage VB-L is applied. In particular, the biasing voltage V-Bias produces, between these two cell bit lines, a potential difference such as to oppose the establishment of the leakage current between the two cell bit lines, in the semiconductor structure on which the memory cell is formed. More particularly, the closer the biasing voltage V-Bias is to the sensing voltage V-BL, the greater is the probability of achieving a condition in which the leakage current is substantially eliminated.

In detail, the memory system 1000 comprises a memory 100 divided into a plurality of memory arrays 110–117, a reading circuit, represented schematically by the symbol for a "sense amplifier" SA, and generating means for supplying the biasing voltage V-Bias. In the embodiment of FIG. 3, the generating means are formed by a "scrambler" circuit SCR. The reading circuit SA generates the sensing voltage V-BL and is preferably a current-reading circuit. As is known, a typical current-reading circuit comprises a reference memory cell and an operational amplifier to the inputs of which a signal derived from the reference cell and a signal derived from the cell being read and correlated with the state or programming of the cell are supplied. The memory system 1000 also comprises a line and selection decoder 102, a first column decoder YM, a first plurality of multiplexers MUX-M0-MUX-M1, a second column decoder YN, and a second plurality of multiplexers MUX-N0-MUX-N7.

In the embodiment of FIG. 3, the memory array 110 is structurally similar or identical to the memory array 110 described above with reference to FIG. 1. For clarity of representation, not all of the reference numerals shown in FIG. 1 are indicated in FIG. 3, but reference may be made to FIG. 1 in the following description. The other memory arrays which are included in the memory matrix 100, and of which only the memory array 117 is shown as a functional block, are similar to the memory array 110.

On the basis of an address code present at its input, the line and selection decoder 102 can supply, on the word lines WL-i, signals which identify the line of the memory cell Qji to be selected. The line and selection decoder 102 can also supply, on the left-hand and right-hand upper selection lines Up-L and Up-R, and on the left-hand and right-hand lower selection lines Dw-L and Dw-R, signals which activate/deactivate conduction of the upper selection transistors TU-0-TU-7 and of the lower selection transistors TD-0-TD-7 present in each memory array 110–117. It should be noted that the scrambler SCR, a particular embodiment of which will be described below, is not a conventional circuit structure for non-volatile memories.

On the basis of a plurality of input signals carrying information relating to the path selected in the memory matrix for the reading of a specific cell, the scrambler SCR supplies, at respective outputs and in accordance with a suitable distribution, two cell-reading signals and the biasing voltage V-Bias. In particular, the reading signals are the sensing voltage V-BL for the reading of the memory cell and the ground voltage GND which serves to bring the memory cell selected to a reading condition, that is, to activate its conductivity.

The plurality of input signals to the scrambler SCR comprises two parity signals Ev, Od and four selection signals Up-L, Up-R, Dw-L, Dw-R which are the same as the signals that are present on the homonymous selection lines described above. The parity signal Ev is, for example, a binary signal-having a high or low logic level when the index i of the bit line Bl-i which is to be brought to a sensing voltage is even or odd, respectively, during the reading of a memory cell. In complementary manner, the parity signal Od has a high or low logic level when the index i of the bit line Bl-i which is to be brought to a sensing voltage is odd or even, respectively, during the reading of a memory cell. The parity signals Ev and Od can be derived from address signals by a suitable decoder EV-OD the construction of which will be clear to a person skilled in the art.

The scrambler SCR has a plurality of output lines comprising a left-hand biasing line B-Lft, a right-hand biasing line B-Rgt, an even sensing line S-Ev, and an odd sensing line S-Od. The biasing voltage V-Bias and the ground voltage GND may be made available on any of the four output lines listed above. The even and odd sensing lines S-Ev and S-Od are intended to make the sensing voltage V-BL available according to the parity of the index of the bit line B1-i involved in the reading operation. In greater detail, the scrambler SCR makes the sensing voltage V-BL available on the even sensing line S-Ev or on the odd sensing line S-Od, respectively, according to whether the bit line BL-i has an even or odd index.

It is pointed out that the left-hand and right-hand biasing lines B-Lft, B-Rgt are monodirectional, whereas the sensing lines S-Ev and S-Od are bidirectional, so that the signal correlated with the state of programming of the cell, that is, the current which is established in the memory cell being read, can reach the sense amplifier SA via the scrambler SCR. Moreover, one of the four output lines S-Ev, S-Od, B-Lft, B-Rgt will have a floating voltage V-Floating during a reading operation. The four output lines S-Ev, S-Od, B-Lft, B-Rgt are connected to each of the multiplexers belonging to the first plurality of multiplexers MUX-M0-MUX-M1. Each multiplexer of this first plurality can be selected by the first column decoder YM.

The first column decoder YM can receive, as an input, a first encoded address signal YM-add, and can supply, on output lines YM-0-YM-7, first control signals which can activate/deactivate one of the multiplexers belonging to the first plurality MUX-M0-MUX-M1. Each of the multiplexers of the first plurality MUX-M0-MUX-M1 has four output lines which can be put into connection with the four input lines S-Ev, S-Od, B-Lft, B-Rgt of the respective multiplexer, in dependence on the selection performed by the first column encoder YM. It is pointed out that, by selecting at least one multiplexer of the first plurality MUX-M0-MUX-M1, the first column encoder YM enables at least one memory array of the plurality of arrays 110–117 to be selected. The four output lines of each multiplexer of the first plurality MUX-M0-MUX-M1 are also connected to a corresponding multiplexer of the second plurality of multiplexers MUX-N0-MUX-N7.

Each multiplexer of the second plurality enables its four input lines to be connected to the appropriate four bit lines which can be selected from the plurality of bit lines BL-0-BL-7 with which each memory array is provided. The connection between the input lines of each multiplexer of the second plurality MUX-N0-MUX-N7 and the appropriate four bit lines of the plurality BL-0-BL-7 is permitted by the second column decoder YN. This second column decoder YN can receive, as an input, a second encoded address signal YN-add, and can supply second control signals on eight output lines YN-0,1-YN-9,10. These second control signals control each multiplexer of the second plurality MUX-N0-MUX-N7, enabling the four input lines of each multiplexer of the second plurality MUX-N0-MUX-N7 to be connected to the appropriate four bit lines of the plurality BL-0-BL-7.

In other words, the first and second column decoders YM and YN, together with the first and second pluralities of multiplexers MUX-M0-MUX-M7 and MUX-N0-MUX-N7, enable the four output lines S-Ev, S-Od, B-Lft, B-Rgt of the scrambler SCR to be connected to the four appropriate bit lines of a selected memory array, on the basis of the address signals YM-add and YN-add. In particular, the memory system 1000 operates by supplying the reading signals, that is, the sensing voltage V-BL and the ground voltages GND, to the cell bit lines to which the memory cell to be read is connected, and at least one biasing voltage V-Bias which can oppose the development of leakage currents to one or more cell bit lines other than those to which the cell being read is connected.

Before a specific example of the operation of the memory system 100 is described in detail, the Table shown in FIG. 4 will be described. This table indicates which reading and biasing signals, suitably generated by the scrambler SCR, should be applied to a memory array such as the array 110 to read a particular memory cell in accordance with the method of the present invention. As described for Table 1, the memory cell to be read and the direction of reading selected can also be identified from the indication of the configuration of the voltages provided by the table of FIG. 4. It is pointed out that, for simplicity of description, the table of FIG. 4, which has a structure similar to that of Table 1, does not show the particular word line WL-j selected. In each line of the table of FIG. 4, the two selection lines (included amongst the lines Up-L, Up-R, Dw-L, Dw-R) which will be activated for the reading of a predetermined memory cell are indicated on the right-hand side of the table.

One bit line of the plurality of bit lines BL-0-BL-7 of the array 110 is indicated in each column in the upper portion of the table of FIG. 4. In each cell of the table of FIG. 4, the particular voltage to which the respective bit line is to be brought in accordance with the particular method described according to the invention is indicated by one of the symbols S, G, B, F. As stated above, the symbol S indicates that, for the operation of the memory system 1000, the bit line of the respective column will adopt the role of a sense-line and will therefore be brought to a sensing voltage V-BL. The symbol G indicates that the bit line of the respective column will be brought to a ground voltage GND. The symbol B indicates that the bit line of the respective column of the table of FIG. 4 will be brought to the biasing voltage V-Bias, and the symbol F indicates that no predetermined potential will be imparted to the corresponding bit line and that this bit line is therefore left floating.

For example, it is assumed that the cell $Q_{65}$ is to be read in the same direction of reading as is shown in FIG. 1. The memory cell $Q_{65}$ is disposed between the cell bit lines BC-4 and BC-5. To read this memory cell $Q_{65}$, the first row of the table of FIG. 4 is considered. It can be seen that, as indicated in this first line of the table, the selection lines Up-L and Dw-L should be activated. The table of FIG. 4 also indicates that the bit line BL-2 should be brought to the sensing voltage V-BL and the bit line BL-3 should be brought to the ground voltage GND. In this situation, as already described with reference to Table 1, the cell bit line BC-4 is brought to the biasing voltage V-BL and the cell bit line BC-5 is brought to the ground voltage GND.

The table of FIG. 4 also indicates that (together with the activation of the lower left-hand and upper left-hand selection lines Dw-L and Up-L) the bit line BL-1 is brought to the biasing voltage V-Bias and the bit line BL-4 is left floating. This corresponds to saying that the cell bit line BC-1 is brought to the biasing voltage V-Bias and that the cell bit line BC-8 is left floating. It should be noted that, if a voltage V-Bias substantially equal to the sensing voltage V-BL is generated, by means of the scrambler SCR, between the two cell bit lines BC-4 and BC-1, there is a substantially zero potential difference. By rendering this potential difference substantially zero, the possibility of a leakage current developing from the cell bit line BC-4 towards the cell bit line BC-1 and, consequently, towards the cell bit lines which have indices "i" of less than four, is thus reduced or prevented.

The cell bit line BC-1 adopts the role of a bit line blocking the leakage current. It is pointed out that other cell bit lines, such as the cell bit lines BC-3 and BC-2, are closer to the bit line BC-4 and could therefore better perform the role of blocking the leakage current. In this connection it should be noted that the selection of the cell bit line BC-4 as the blocking bit line is due to the fact that, to bring the cell bit lines BC-3 and BC-2 to the voltage V-Bias=V-BL, it would be necessary to activate the selection line Dw-R and the selection line Up-R, respectively. As is clear from the foregoing description of the methods by which a predetermined memory cell is accessed, the activation of these other selection lines is incompatible with the activation of the selection lines Dw-L and Up-L which is necessary to access the cell $Q_{65}$. Owing to the specific architecture of the memory array described, the cell bit line BC-1 is the closest usable cell bit line to the cell bit line BC-4. It should also be noted that the cell bit line BC-1 is disposed, on the memory matrix 110, on the opposite side of the memory cell $Q_{65}$ to be read to the cell bit line BC-5 which is to be brought to the ground voltage GND.

It is pointed out that, by virtue of the teachings of the present invention, it is possible to oppose the development of leakage currents during the reading of a predetermined cell, to the extent of eliminating them. It is therefore possible to avoid the use of expensive and complex dynamic approaches but to achieve satisfactory performance by performing a current reading.

According to a particular embodiment of the invention, to read a memory cell, the memory system 1000 operates in the following manner. On the basis of the address signals YM-add and YN-add, the decoder EV-OD provides the values of the parity signals Ev and Od which are supplied to the scrambler SCR. On the basis of address codes, the line and selection decoder 102 generates, on the word line WL-i, the signals which identify the row of the memory cell Qji to be selected and the signals Up-L, Up-R, Dw-L, Dw-R. Since, in the embodiment of FIG. 1, the selection transistors TU-0-TU-7 and TD-0-TD-7 are of the n-type, the signals Up-L, Up-R, Dw-L, Dw-R are of high logic level when the selection transistors which are present on the respective selection line are to be activated for conduction and are of low logic level when conduction of the transistors is to be deactivated.

The signals Up-L, Up-R, Dw-L, Dw-R are also sent to the scrambler SCR which generates the output voltages V-Bias, V-BL, GND, and V-floating on the lines B-Lft, B-Rgt, S-Ev, and S-Od. In particular, the voltages V-Bias, V-BL, GND, and V-floating are distributed on the lines B-Lft, B-Rgt, S-Ev, and S-Od in a manner such as to conform to the configurations of Table 4. By generating the signals YM-0-YM-7, the first column decoder YM selects a single multiplexer of the first plurality MUX-M0-MUX-M1. The multiplexer thus selected will have the voltages V-Bias, V-BL, GND and V-Floating on its four output lines.

By suitably generating the signals YN-0, 1-YN-14,15, the second column decoder YN causes a single multiplexer of the plurality MUX-N0-MUX-N7 to have, as outputs, the voltages V-Bias, V-BL, GND, and V-Floating, distributed appropriately to some of the bit lines of BL-0-BL-7. Thus, the sensing voltage V-BL and the ground voltage GND are supplied to the memory array selected so as to permit reading of the selected cell, and the biasing-voltage V-Bias and the floating voltage V-Floating are supplied to the array in a manner such as to oppose the development of leakage currents.

Figure 5:
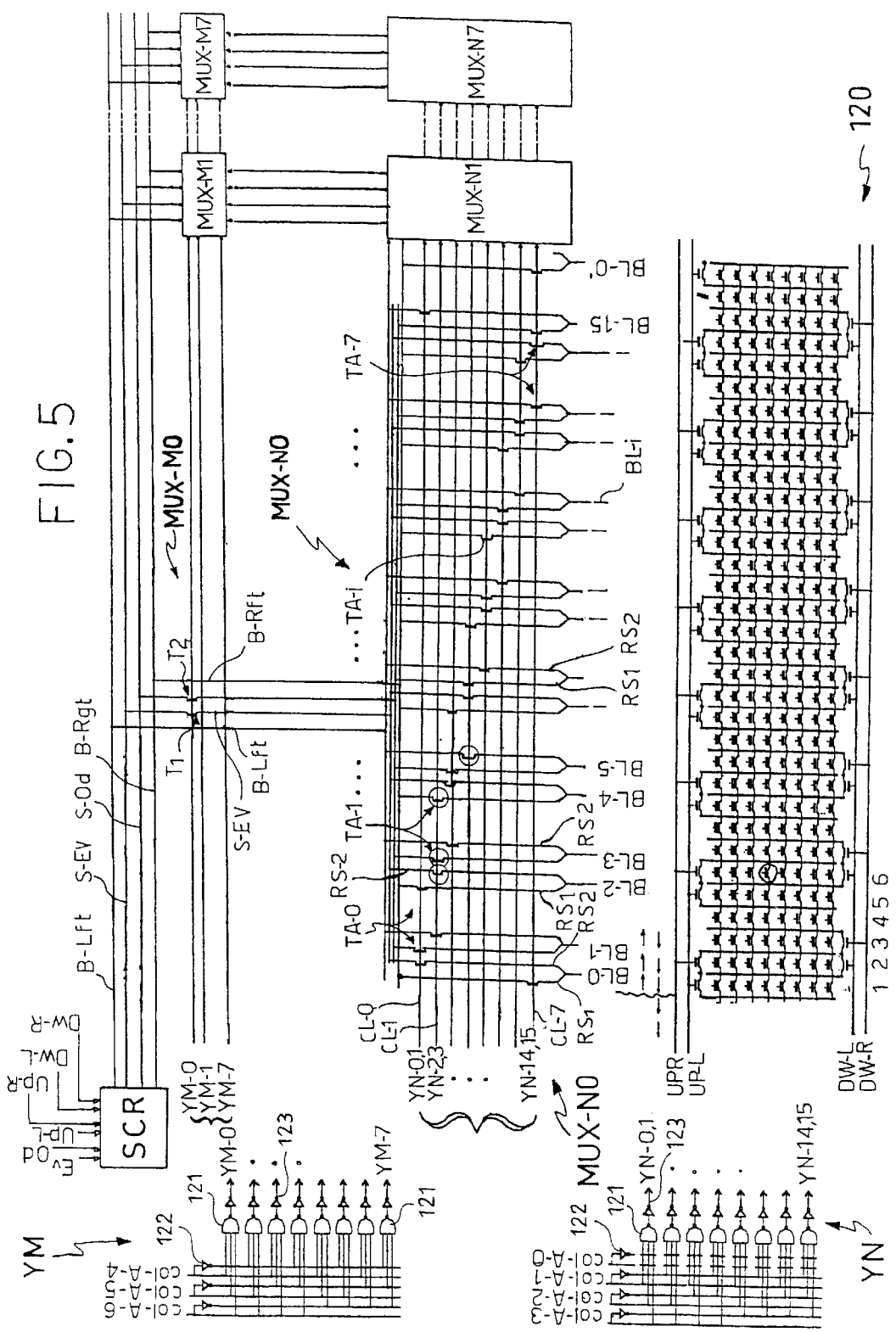
FIG. 5 is a schematic diagram of an example of the internal structure of multiplexers in the system of FIG. 3.

FIG. 5 shows a memory system 2000 similar to the memory system 1000 described above with reference to FIG. 4. In FIG. 5, all of the components which are identical or similar to those described above are indicated by the same reference numerals. For simplicity of representation, a single memory array 120 is shown in FIG. 5 and the sense amplifier SA, the line and selection decoder 102, and the decoder EV-OD are not shown. The memory array 120 is structurally similar to the array 110 described above but comprises a larger number of columns of memory cells than are included in the memory array 110.

In the memory system 2000, specific embodiments of the first and second column decoders YM and YN are shown. The first and second column decoders YM and YN are provided, respectively, with three inputs col-A4-col-A6 and with four inputs col-A0-col-A3 for receiving, altogether, an input code such as a 7-digit binary word. The column decoders YM and YN are also provided, respectively, with outputs YM-0-YM-7 and YN-0,1-YN-14,15 for making available the first and second control signals, respectively. The first and second decoders YM and YN are typically combinatory networks and comprise, in the embodiment shown, NAND logic gates 121 with three inputs and NOT logic gates 122 and 123. For each input signal col-A0-col-A6, a respective negated signal is supplied by means of the NOT logic gate 122. The input signals and/or their negated signals are supplied to the inputs of corresponding NAND gates 121 and the outputs of these gates are negated by the NOT gates 123.

The multiplexer MUX-MO comprises, as inputs, the two lines B-Lft and B-Rgt which are applied directly as outputs of the multiplexer. The two input lines S-Ev and S-Od of the multiplexer MUX-M0 are connected to respective activation/deactivation transistors T1 and T2. For example, the activation/deactivation transistors T1 and T2 are two n-channel MOSFET transistors. Both of the gate terminals of the activation/deactivation transistors T1 and T2 are connected to the output YM-0 of the first column decoder YM. When a high logic level signal (a logic 1) is present at this output YM-0, the two transistors T1 and T2 are activated for conduction and the signals which are present on the lines S-Ev and S-Od, and which are generated by the scrambler SCR, are applied as outputs of MUX-M0 or, conversely, the signals coming from the memory array 120 are applied as inputs to the scrambler SCR. When a low logic level (a logic 0) is present at the output YM-0, the electrical connection between the output lines S-Ev and S-Od of the scrambler SCR and the output of the MUX-M0 is interrupted.

The multiplexers MUX-M1-MUX-M7 are similar to MUX-M0 and each has two activation/deactivation transistors (not shown), similar to the transistors T1 and T2. For each multiplexer MUX-M1-MUX-M7, the respective activation/deactivation transistors have their gate terminals connected to a different output line YM-1-YM-7. The multiplexer MUX-NO formed in accordance with the invention comprises, as inputs, the two lines S-Ev and S-Od and the two lines B-Lft, B-Rgt and, as outputs, the bit lines BL-0-BL-15. A further bit line BL-0' is shown in FIG. 5. These bit lines BL-0-BL-15 have the same function as the bit lines described with reference to FIGS. 1 and 3. It is pointed out that known multiplexers use only two input lines for the reading signals and the lines B-Lft, B-Rgt thus represent additional input lines for this multiplexer.

The multiplexer MUX-N0 has selective connection means which enable the lines S-Ev and S-Od, which relate to the reading signals, to be connected to two appropriate first bit lines which can be selected from the plurality of bit lines BL-0-BL-7. The selective connection means also enable the two additional input lines B-Lft, B-Rgt, which are available for the biasing voltage V-Bias, to be connected to two second bit lines that are different from the first bit lines and that can be selected from the same plurality of bit lines BL-0-BL-7. The selection of the bit lines from within the plurality BL-0-BL-7 takes place substantially simultaneously.

In the embodiment of FIG. 5, the selective connection means comprise first selection lines or branches RS1, second selection lines or branches RS2, a plurality of activation/deactivation transistors TA-0-TA-7, and a plurality of control lines CL-0-CL-7. The first and second selection branches RS1 and RS2 connect the lines B-Lft, B-Rgt, S-Ev and S-Od to the bit lies BL-0-BL-15.

In the particular embodiment of FIG. 5, each bit line BL-i is connected to a selection branch RS1 (shown on the left of the respective bit line in FIG. 5) and to a selection branch RS2 (shown on the right of the respective bit line in FIG. 5). Moreover, each bit line BL-i has one selection branch RS1 (RS2) connected to one of the lines B-Lft, B-Rgt and the other RS2 (RS1) connected to one of the lines S-Ev, S-Od. The plurality of activation/deactivation transistors TA-0-TA-7 is associated with the first and second plurality of selection branches RS1 and RS 2. These activation/deactivation transistors enable specific output bit lines of MUX-N0 to be selected by the activation or deactivation of conduction in the selection branches with which they are associated. Preferably, a single activation/deactivation transistor is associated with each selection line RS1, RS2.

The plurality of control lines CL-0-CL-7 is connected to the column decoder YN and is intended to supply control signals to the activation/deactivation transistors TA-0-TA-7. For example, each activation/deactivation transistor TA-i is a MOSFET having its gate terminal connected to a control line of the eight lines CL-0-CL-7 and having its drain and source terminals connected to the respective selection line. It is pointed out that each of the control lines CL-0-CL-7 is advantageously connected to at least two activation/deactivation transistors of the plurality TA-0-TA-7.

In particular, in the embodiment shown in FIG. 5, each of the control lines CL-0-CL-7 is connected, within the multiplexer MUX-N0, to four activation/deactivation transistors of the plurality TA-0-TA-7 (the activation/deactivation transistor connected to the bit line BL-0' is excluded from the count). The respective control lines CL-0-CL-7 activate/deactivate conduction of the respective transistors TA-0-TA7 substantially simultaneously.

The multiplexers MUX-N1-MUX-N7 are similar to the multiplexer MUX-N0 described. When the multiplexer MUX-N0 is in operation, the control signals YN-0,1-YN-14,15 control the activation/deactivation transistors appropriately so as to distribute the reading voltages V-BL and GND and the biasing voltages V-Bias and V-Floating to the bit lines. For example, reference is made to the third line of the table of FIG. 4. It is clear from the foregoing descriptions that this third line relates to the reading of a memory cell disposed between the cell bit lines BC-5 and BC-6. In FIG. 5, a possible memory cell affected by this reading has been indicated by a circle in column 6 of the array 120. The bit line in which the sensing voltage V-BL is to be made available is the bit line BL-2, that is, an even bit line, whereas the ground voltage GND is to be available on the bit line BL-3.

In the particular example considered, the biasing voltage V-Bias which will be supplied to the bit lines BC-9 and BC-10 will be made available on both of the bit lines BL-4 and BL-5. The effect in reducing the development of leakage currents is thus particularly efficient. The transistors T1 and T2 of MUX-M0 will be considered to be activated for conduction. In this situation, the activation/deactivation transistor (circled in FIG. 5) of the branch RS2 connected to the bit line BL-2 is activated for conduction. This causes the desired voltage V-BL associated with the output line S-Ev from the scrambler SCR to be available on the bit line BL-2. The activation/deactivation transistor (circled in FIG. 5) of the branch RS1 connected to the bit line BL-3 is also activated for conduction. The desired voltage GND associated with the output line S-Od from the scrambler SCR is thus available on the bit line BL-3.

Similarly, the two transistors (circled in FIG. 5) corresponding to the selection branches RS1 of the bit line BL-4 and RS2 of the bit line BL-5 will be activated for conduction. This causes the voltage V-Bias present on the lines B-Lft and B-Rgt to be made available on the bit lines BL-4 and BL-5 (in order to be supplied to the cell bit lines BC-9 and BC-10). It should be noted that the multiplexer MUX-N0 according to the invention enables the biasing voltage V-Bias to be supplied to the memory matrix without significantly complicating or altering the method by which the memory cell is accessed for reading. Moreover, this multiplexer is compatible with the current reading technique.

In particular, it should be noted that the above-described ability to supply the same control signal (for example, the signal YN-2, 3) via a single control line such as the line CL-1, to activate three transistors TA-1 for conduction is particularly advantageous. In fact, this particular architecture enables the signals from four input lines (that is, the lines S-Ev, S-Od and the additional lines B-Lft and B-Rgt) to be distributed to the plurality of bit lines (BL-0-BL-15) whilst, at the same time, having uniformity in the electrical layout and a small number of lines activated simultaneously. In this connection, it is pointed out that, in conventional multiplexers, each control line is connected to a single activation/deactivation transistor relating to a memory array.

Moreover, the teachings of the present invention relating to the multiplexer MUX-N0 are applicable not only in the particular situation in which the additional signal is used to reduce the leakage current, but also for any other purpose which may be identified. The multiplexer MUX-N0 can be produced with the use of conventional integration techniques.

Figure 6:
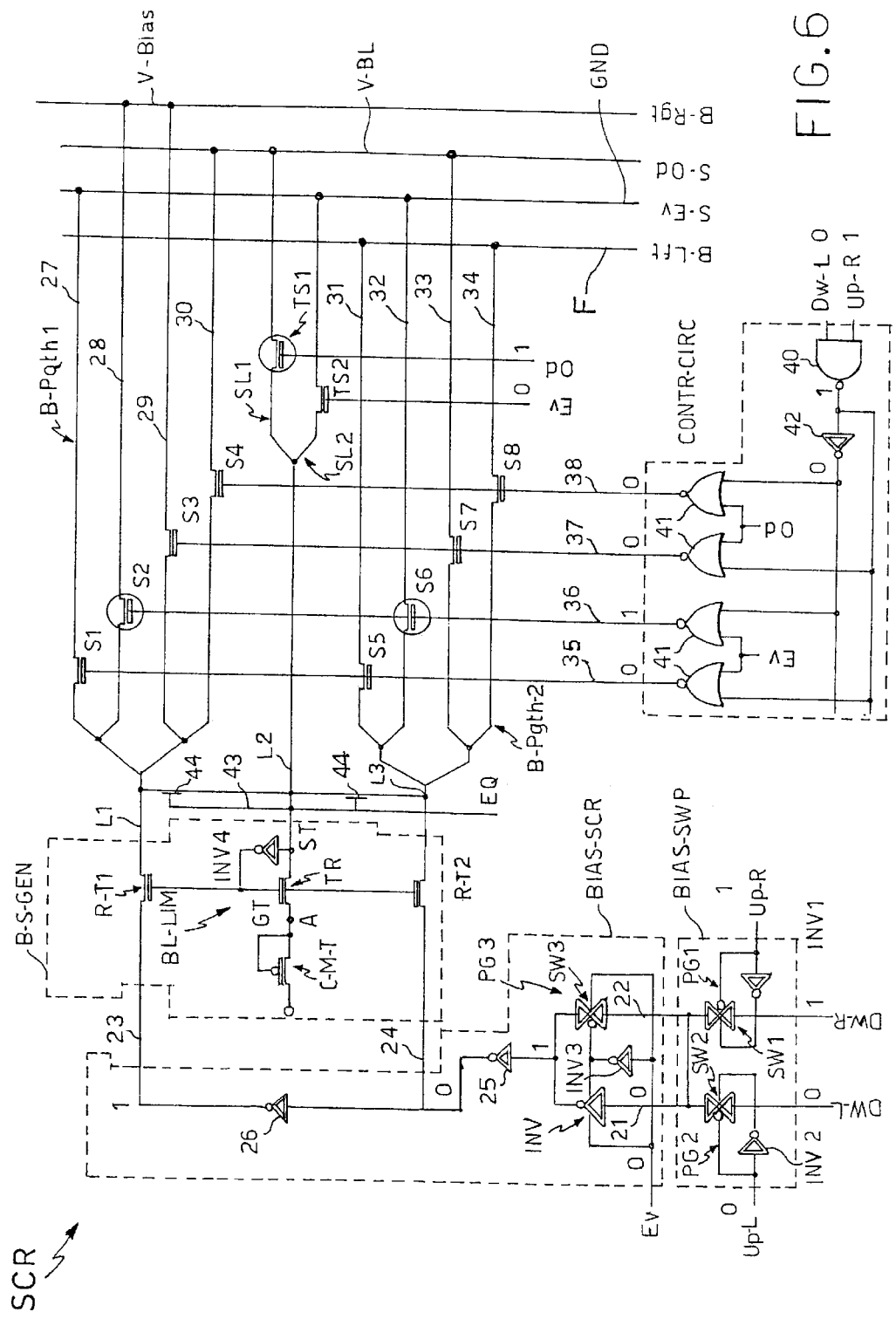
FIG. 6 is a schematic diagram of an embodiment of a scrambler circuit used in the system of FIG. 3.

FIG. 6 shows a preferred embodiment of the scrambler SCR comprising a bias-changing or "swapping" circuit BIAS-SWP, a bias-scrambling circuit BIAS-SCR, a generating circuit B-S-GEN, a first plurality and a second plurality of bias-signal lines or paths B-Path1 and B-Path2, two sensing lines SL1 and SL2, and a control circuit CONTR-CIRC for the first and second pluralities of lines B-Path1 and B-Path2. The swapping circuit BIAS-SWP is such as to provide an output signal which can adopt two possible voltage levels, that is, a low level and a high level, in dependence on the signals present on the selection lines Up-L, Up-R, Dw-L, Dw-R which are activated for access to a particular memory cell Qji. This swapping circuit BIAS-SWP comprises a first switch or pass-gate pG1 having, as an input signal, the signal of the line Dw-R and, as a control signal, the signal of the line Up-R.

In particular, the pass-gate PG1 may be formed in conventional manner, for example, by CMOS technology, and comprises an inverter INV1 for the control of a switch element SW1. For example, the switch element SW1 includes a pair of n-type and p-type MOS transistors (not shown) which are connected in parallel in accordance with methods known in the art. In accordance with the symbols used FIG. 6, the output of the inverter INV1 of the pass-gate PG1 is connected to a gate terminal of an n-type transistor of the switch element SW1 and the input line Up-R is connected directly to a gate terminal of a p-type transistor. The pass-gate PG1 is thus closed (that is, the signal Dw-R is transmitted as an output) when the signal Up-R is of low level, and is open (that is, the signal Dw-R is not transmitted as an output) when the signal Up-R is of high level.

The swapping circuit BIAS-SWP also comprises a second pass-gate PG2 having an inverter INV2 and a switch element SW2. The second pass-gate PG2 is similar to the first pass-gate PG1 and is closed (open) when the control signal Up-L is of low (high) level. It will be noted that, when the particular memory system 1000 described above is in operation, the signals Up-L and Up-R do not simultaneously adopt the same value. The first and the second pass-gates PG1 and PG2 have respective outputs which are short-circuited to one another and are connected to two inputs 21 and 22 of the bias-scrambling circuit BIAS-SCR.

This bias-scrambling circuit BIAS-SCR supplies, on respective output lines 23 and 24, two voltage signals of opposite levels in accordance with a configuration, on these output lines, which depends on the parity signals Ev or Od and on the signal received on the input lines 21 and 22. The scrambling circuit BIAS-SCR comprises a pass-gate PG3 including a switch element SW3 and an inverter INV3. The pass-gate PG3 receives, as an input, the signal which is present on the line 22 and has the parity signal Ev as a control signal. The pass-gate PG3 may be formed in similar manner to the pass-gate PG1 but, unlike the latter, is closed (open) when the control signal Ev is of high (low) logic level.

The bias-scrambler circuit BIAS-SCR also comprises an inverting switch INV controlled by the parity signal Ev. In the example given, the switch INV acts as an open switch for signals Ev of high logic level and acts as an inverting gate for signals Ev of low logic level. For example, the inverting switch INV can be formed in a manner clear to a person skilled in the art, by a conventional inverter comprising a pair of complementary MOS transistors (not shown) having their gate terminals connected to one another. Each of these transistors is connected in series with a respective activation transistor (of homonymous type) driven by the parity signal Ev.

Moreover, the outputs of the inverting switch INV and of the pass-gate PG3 are short-circuited and are connected to the input of an inverter 25 to the output of which the output line 24 of the scrambling circuit BIAS-SCR is connected. The output of the inverter 25 is connected to an inverter 26 and then to the output line 23 of the scrambling circuit BIAS-SCR. For a predetermined value of the signal present on the input lines 21 and 22 of the scrambling circuit BIAS-SCR, the switching of the signal Ev from one logic level to another causes switching of the logic level of the signal present on the lines 23 and 24, respectively.

The generating circuit B-S-GEN has an output line L2 for making the sensing voltage V-BL available, and two output lines L1 and L3 for making the biasing voltage V-Bias or the ground voltage GND available, according to the signals present on the lines 23 and 24. The generating circuit B-S-GEN shown in FIG. 6 comprises a transistor C-M-T forming part of a conventional current mirror of the sense amplifier SA. The transistor C-M-T which, for example, is a p-type MOSFET having its gate connected to its own drain terminal, supplies the current for the reading or sensing of a generic cell.

In the embodiment of FIG. 6, electronic regulation means are connected to the terminal A and are formed, in the example, with a conventional limiter BL-LIM comprising an n-type transistor TR, the source and gate terminals ST and GT of which are connected for feedback by an inverter INV4. As is known, the limiter BL-LIM enables the voltage of the source terminal ST to be kept at a desired value via a feedback. This voltage of the source terminal ST is the voltage necessary for the reading of a generic cell and is thus the sensing voltage V-BL.

The generating circuit B-S-GEN also comprises two regulation transistors R-T1 and R-T2 which are connected repetitively to the output lines 23 and 24 of the bias-scrambling circuit BIAS-SCR. These regulation transistors R-T1 and R-T2 enable the voltage V-Bias and the voltage GND to be configured alternatively and reversibly on the lines L1 and L3. The regulation transistors R-T1 and R-T2 are preferably of dimensions such as to be substantially identical to the transistor TR connected to the line L2 for making available the sensing voltage V-BL. Moreover, the regulation transistors R-T1 and R-T2 have their gate terminals connected to the same gate terminal GT of the transistor TR. This enables the voltage applied to the gate terminals of the regulation transistors R-T1 and R-T2 to be regulated in the same manner in which the voltage applied to the terminal GT of the transistor TR varies. If the characteristic dimensions of the regulation transistors R-T1 and R-T2 are selected in a manner such that they are substantially equal to those of the transistor TR, and if the gate terminals of these transistors are regulated as described above, it is possible to arrange for the biasing voltage V-Bias present on one of the lines L1, L3 to be substantially equal to the sensing voltage V-BL present on the line L2.

For example, a situation is considered, in which a voltage of high logic level and of a value substantially equal to the supply voltage Vcc is present on the output line 23 of the bias-scrambling circuit BIAS-SCR. The regulation transistor R-T1 advantageously limits the voltage value transferred by the line 23 to the line L1 connected thereto (that is, the biasing voltage V-Bias) to a value substantially equal to the sensing voltage V-BL. In the situation explained above, a low logic-level signal, that is, the voltage GND, is present on the output line 24 of the bias-scrambling circuit BIAS-SCR and is transmitted in full by the regulation transistor R-T2 on the line L3. In this configuration, the lines L2 and L3 will bias and read the selected cell whilst the line L1 will introduce the biasing voltage V-Bias necessary for isolation.

It is pointed out that the ability to derive the biasing voltage V-Bias from the reading circuit SA and from the sensing voltage V-BL in accordance with the above-described method is particularly advantageous because it ensures that the biasing voltage V-Bias is substantially equal to the sensing voltage V-BL. Nevertheless, it is pointed out that the voltage V-Bias may be generated by generating means independent of the reading circuit SA, that is, such as to generate the biasing voltage independently and without processing the sensing voltage produced by the reading circuit.

The generating circuit B-S-GEN preferably has an equalizer circuit comprising a line 43 provided with transistors 44 having gate terminals to which a control signal EQ can be applied. When the transistors 44 are activated for conduction, the line 43 enables the three output lines L1, L2 and L3 of the generating circuit 44 to be short-circuited so as to equalize the potentials of these lines before the reading of a memory cell. After this initialization, the short-circuit formed by the line 43 is opened, deactivating conduction of the transistors 44 to enable the memory cell to be read. Connected to the output line L2 are the two sensing lines SL1 and SL2, each of which is provided with a respective selection transistor TS1 or TS2 in which conduction can be activated/deactivated, respectively, by the parity signal Ev and by the parity signal Od, which are applied to the gate terminals of these transistors, respectively. The sensing lines SL1 and SL2 are connected to the even sensing line S-Ev and to the odd sensing line S-Od, respectively. The selection transistors TS1 and TS2 enable the sensing voltage V-BL present on the line L2 to be supplied selectively to the even sensing line S-Ev and to the odd sensing line S-Od.

The output line L1 (L2) of the generating circuit B-S-GEN is connected to the first (second) plurality of lines B-Path1 (B-Path2) comprising the lines 27 and 30 (32 and 33) which are connected, respectively, to the even sensing line S-Ev and to the odd sensing line S-Od, and the lines 28 and 29 (31 and 34), both of which are connected to the right-hand (left-hand) biasing line B-Rgt (B-Lft). The lines 27–30 (31–34) of the first (second) plurality B-Path1 (B-Path2) are provided, respectively, with selection transistors S1–S4 (S5–S8) in which conduction can be activated/deactivated by signals which are present on output lines 35–38 of the control circuit CONTR-CIRC and which are applied to their gate terminals.

By controlling the selection transistors S1–S8, the control circuit CONTR-CIRC enables the voltages present on the output lines L1, L3 of the generating circuit B-S-GEN to be distributed appropriately to the output lines B-Lft, B-Rgt, S-Ev, S-Od of the scrambler SCR. The control circuit CONTR-CIRC comprises a NAND gate 40 the input of which is connected to the lower left-hand selection line Dw-L and to the upper right-hand selection line Up-R. The output of the NAND gate 40 is connected, directly or via an inverter 42, to two NOR gates 41 which have two inputs and to which the parity signals Ev and Od are also applied.

The control circuit CONTR-CIRC provides the signals for controlling the selection transistors S1–S8 on the basis of the signals present on the selection lines Dw-L and Up-R and of the parity signals Ev and Od, arranging for the correct biasings to be configured along the specific path in the region of the cell selected.

An example of the operation of the scrambler SCR will be described below. Reference is made to the table of FIG. 4 and, in particular, to the eighth line, indicated by an arrow. According to this line of the table of FIG. 4, the signals Up-R and Dw-R are of high logic level and the sensing voltage V-BL is to be made available on the bit line BL-3 (of odd parity), the ground voltage GND is to be made available on the bit line BL-2, the biasing voltage V-Bias (which, in particular, is equal to the sensing voltage V-BL) is to be made available on the bit line BL-4 (which lies to the right of the bit line BL-3), and the floating voltage is to be made available on the bit line BL-1.

According to this configuration, and with reference to FIG. 1, the cells disposed between the cell bit line BC-6 and the cell bit line BC-7, that is, the cells of the seventh column of the memory matrix 110, are read. In particular, the cell bit line BC-6 is to be brought to the ground voltage GND, and the cell bit line BC-7 has the role of the drain terminal to which the sensing voltage V-BL1s applied. In this case, the parity signal Ev is of low logic level and the parity signal Od is of high logic level.

FIG. 6 shows the logic levels (1, 0) of the signals present at the inputs and the outputs of the circuits of the scrambler SCR in this particular example. In these conditions, the first pass-gate PG1 of the bias-swapping circuit BIAS-SWP is open, since the control input Up-R is of high logic level. The second pass-gate PG2 of the same circuit BIAS-SWP is closed, since the control input Up-L is of low logic level, and transmits the signal Dw-L (of low logic level) on the short-circuited lines 21 and 22. The low logic-level control signal Ev is applied to the third pass-gate PG3 included in the bias-scrambling circuit BIAS-SCR and this pass-gate PG3 is thus opened.

The inverting switch INV, which is controlled by the signal Ev, is closed so as to invert the logic level of the signal present on the line 21, supplying, at its own output, a high logic-level signal. This high logic-level signal is inverted by the inverter 25 and is then presented on the line 24. The signal output by the inverter 24 is also inverted by the inverter 26 and is then made available on the line 23 with a high logic level.

A voltage signal of high logic level and equal to the supply voltage Vcc is thus present on the output line 23 of the bias-scrambling circuit BIAS-SCR and a signal of low logic level, equal to the ground voltage GND, is present on the line 24. On the basis of these input signals which are present on the lines 23 and 24, and as described above, the generating circuit B-S-GEN will supply the biasing voltage V-Bias, which is substantially equal to the sensing voltage V-BL, on the output line L1, and the ground voltage GND on the output line L3. The sensing voltage V-BL derived from the sense amplifier SA is present on the output line L2. The inputs Dw-L and Up-R of low and high logic value, respectively, are applied to the NAND gate 40 of the control circuit CONTR-CIRC.

At the output of the control circuit CONTR-CIRC, there is a high logic level signal on the output line 36 and, on the remaining lines 35, 37, 38, there are low logic-level signals. In this situation, the selection transistors S6 and S2, which are circled in FIG. 6, are activated for conduction. Thus, the biasing voltage V-Bias will be present on the right-hand biasing line B-Rgt and the ground voltage GND will be present on the even sensing line S-Ev. The high parity signal Od activates the selection transistor TS1 (circled in FIG. 6) for conduction, thus causing the sensing voltage V-BL to be available on the odd sensing line S-Od. Since the left-hand biasing line B-Lft is not connected to any of the output lines of the generating circuit B-S-GEN, it is at the floating voltage V-Floating. The reading voltages V-BL, GND and the biasing voltage V-Bias, which are distributed appropriately on the output lines of the scrambler SCR, are thus supplied by the multiplexers MUX-MO, MUX-N0 to the bit lines BL-1, BL-2, BL-3, BL-4, biasing the region surrounding the selected cell in accordance with the table of FIG. 4.

Naturally, to satisfy contingent and specific requirements, a person skilled in the art may apply to the above-described memory system many modifications and variations, all of which, however, are included with the scope of protection of the invention as defined by the appended claims.

That which is claimed is:

1. A memory system comprising:
    a memory matrix formed on a semiconductor structure, the memory matrix including
        a first column line and a second column line which are connected electrically to at least one first memory cell to be read by a first reading voltage supplied to the first column line, and
        a third column line distinct from the first column line and from the second column line; and
        a generating means for supplying an additional voltage to the third column line during the reading of the at least one first memory cell.

2. The memory system according to claim 1 wherein the additional voltage permits a potential difference to be produced between the first column line and the third column line, the potential difference being such as to substantially eliminate the establishment of an electric current between the first column line and the third column line in the semiconductor structure.

3. The system according to claim 1 wherein the additional voltage is substantially equal to the first reading voltage.

4. The system according to claim 1 wherein the generating means comprises a plurality of output lines for the first reading voltage and for the additional voltage, these voltages being distributed on the output lines in accordance with a configuration which depends on a position, and on a reading condition, of the at least one first cell in the memory matrix.

5. The system according to claim 1 wherein the memory matrix further comprises at least one intermediate column line connected to at least one second memory cell, and interposed between the first and third column lines.

6. The system according to claim 1, further comprising, a reading circuit for reading the at least one memory cell by supplying the first reading voltage at an output terminal and for receiving a programming state signal correlated with a programming state of the at least one first memory cell.

7. The system according to claim 6, wherein the generating means is electrically connected to the reading circuit so as to generate the additional voltage from the first reading voltage.

8. The system according to claim 7 wherein the output terminal of the reading circuit is provided with first electronic regulation means for keeping the first reading voltage substantially constant.

9. The system according to claim 1 wherein the generating means comprises a generating circuit provided with a first output terminal for the additional voltage, a second output terminal for the first reading voltage, and a third output terminal for a second reading voltage to be supplied to the second column line to bring the at least one first cell to a reading condition.

10. The system according to claim 9, wherein the output terminal of the reading circuit is provided with first electronic regulation means for keeping the first reading voltage substantially constant, and wherein the first and third output terminals are provided, respectively, with second electronic regulation means which are connected to the first regulation means to keep the additional voltage supplied by the generating means substantially equal to the first reading voltage.

11. The system according to claim 10 wherein the generating means comprises a plurality of output lines for the first reading voltage and for the additional voltage, these voltages being distributed on the output lines in accordance with a configuration which depends on a position, and on a reading condition, of the at least one first cell in the memory matrix, and wherein the plurality of output lines comprises four output lines which can be connected selectively to the first output terminal, to the second output terminal, and to the third output terminal of the generating circuit to provide the first reading voltage, the second reading voltage, the additional voltage, and a floating voltage.

12. The system according to claim 4 wherein the generating means comprises a plurality of input lines for input signals correlated with the position of the first column line and of the second column line in the memory matrix and with the reading condition of the at least one first memory cell, the generating means distributing voltages to the four output lines on the basis of the input signals.

13. The system according to claim 12 wherein the input signals to the generating means are produced from a first plurality of signals supplied to the memory matrix to select the at least one cell.

14. The system according to claim 10 wherein the four output lines can be connected, selectively and substantially simultaneously, to a plurality of reading lines, the reading lines being selectively connectable to a plurality of column lines of the memory matrix and comprising a first reading line, a second reading line, and a third reading line which are connectable, respectively, to the first column line, to the second column line and to the third column line.

15. The system according to claim 14 wherein the generating means receives at least one parity signal representative of the even/odd nature of an index associated with each reading line of the plurality of reading lines.

16. The system according to claim 11 further comprising, a reading circuit for reading the at least one memory cell by supplying the first reading voltage at an output terminal and for receiving a programming state signal correlated with a programming state of the at least one first memory cell, and wherein the four output lines of the generating means comprise at least one monodirectional line for making the additional voltage available and two bidirectional lines for, alternatively, making the first reading voltage available, and for supplying the programming state signal to the reading circuit.

17. The system according to claim 14, further comprising a multiplexer having a plurality of control lines for receiving control signals for a plurality of transistors in which conduction can be activated/deactivated, the plurality of transistors permitting each of the four output lines to be connected/disconnected substantially simultaneously to/from each reading line of the plurality of reading lines.

18. The system according to claim 17 wherein at least two transistors of the plurality of transistors are associated with at least one control line of the plurality of control lines.

19. The system according to claim 4 wherein the plurality of output lines of the generating means are connected to the memory matrix in a region surrounding the first memory cell.

20. The system according to the claim 6 wherein the generating means generates the additional voltage independently of the reading circuit.

21. The system according to claim 1 wherein the third column line is disposed as close as possible to the first column line in the semiconductor structure and is disposed in a first portion of the semiconductor structure which is on the opposite side of the at least one memory cell to a second portion, in which the second column line is disposed.

22. A semiconductor memory system comprising:
a memory matrix including
 a first column line and a second column line which are each connected to at least one first memory cell to be read by a first reading voltage supplied to the first column line, and
 a third column line separate from the first column line and from the second column line; and
 a generating circuit for supplying an additional voltage to the third column line when the first reading voltage is supplied to the first column line to read the at least one first memory cell.

23. The system according to claim 22 wherein the additional voltage produces a potential difference between the first column line and the third column line to substantially eliminate a current between the first column line and the third column line.

24. The system according to claim 22 wherein the additional voltage is substantially equal to the first reading voltage.

25. The system according to claim 22 wherein the generating circuit comprises a plurality of output lines for the first reading voltage and for the additional voltage, these voltages being distributed on the output lines in accordance with a configuration which depends on a position, and on a reading condition, of the at least one first cell in the memory matrix.

26. The system according to claim 22 wherein the memory matrix further comprises at least one intermediate column line connected to at least one second memory cell, and interposed between the first and third column lines.

27. The system according to claim 22, further comprising, a reading circuit for reading the at least one first memory cell by supplying the first reading voltage at an output terminal and for receiving a programming state signal based upon a programming state of the at least one first memory cell.

28. The system according to claim 27, wherein the generating circuit is connected to the reading circuit to generate the additional voltage from the first reading voltage.

29. The system according to claim 28 wherein the output terminal of the reading circuit is provided with a first regulation circuit for keeping the first reading voltage substantially constant.

30. The system according to the claim 22 wherein the generating circuit comprises a first output terminal for the additional voltage, a second output terminal for the first reading voltage, and a third output terminal for a second reading voltage to be supplied to the second column line to bring the at least one first cell to a reading condition.

31. The system according to claim 30, wherein the output terminal of the reading circuit is provided with a first regulation circuit for keeping the first reading voltage substantially constant, and wherein the first and third output terminals are provided, respectively, with a second regulation circuit connected to the first regulation circuit to keep the additional voltage supplied by the generating circuit substantially equal to the first reading voltage.

32. The system according to claim 31 wherein the generating circuit comprises a plurality of output lines for the first reading voltage and for the additional voltage, these voltages being distributed on the output lines in accordance with a configuration which depends on a position, and on a reading condition, of the at least one first cell in the memory matrix, and wherein the plurality of output lines comprises four output lines which can be connected selectively to the first output terminal, to the second output terminal, and to the third output terminal of the generating circuit to provide the first reading voltage, the second reading voltage, the additional voltage, and a floating voltage.

33. The system according to claim 25 wherein the generating circuit comprises a plurality of input lines for input signals correlated with the position of the first column line and of the second column line in the memory matrix and with the reading condition of the at least one first memory cell, the generating circuit distributing voltages to the four output lines on the basis of the input signals.

34. The system according to claim 33 wherein the input signals to the generating circuit are produced from a first plurality of signals supplied to the memory matrix to select the at least one cell.

35. The system according to claim 31 wherein the four output lines can be connected, selectively and substantially simultaneously, to a plurality of reading lines, the reading lines being selectively connectable to a plurality of column lines of the memory matrix and comprising a first reading line, a second reading line, and a third reading line which are connectable, respectively, to the first column line, to the second column line and to the third column line.

36. The system according to claim 35 wherein the generating circuit receives at least one parity signal representative of the even/odd nature of an index associated with each reading line of the plurality of reading lines.

37. The system according to claim 32 further comprising, a reading circuit for reading the at least one memory cell by supplying the first reading voltage at an output terminal and for receiving a programming state signal correlated with a programming state of the at least one first memory cell, and wherein the four output lines of the generating circuit comprise at least one monodirectional line for making the additional voltage available and two bidirectional lines for, alternatively, making the first reading voltage available, and for supplying the programming state signal to the reading circuit.

38. The system according to claim 35, further comprising a multiplexer having a plurality of control lines for receiving control signals for a plurality of transistors, the plurality of transistors permitting each of the four output lines to be connected/disconnected substantially simultaneously to/from each reading line of the plurality of reading lines.

39. The system according to claim 38 wherein at least two transistors of the plurality of transistors are associated with at least one control line of the plurality of control lines.

40. The system according to claim 25 wherein the plurality of output lines of the generating circuit are connected to the memory matrix in a region surrounding the first memory cell.

41. The system according to claim 27 wherein the generating circuit generates the additional voltage independently of the reading circuit.

42. A method of reading a semiconductor memory matrix comprising a first column line and a second column line which are electrically connected to at least one first memory cell to be read, and a third column line separate from the first and second column lines, the method comprising:

supplying a first reading voltage to the first column line for the reading of the at least one first memory cell; and supplying an additional voltage to the third column line when the first reading voltage is supplied to the first column line to read the at least one first memory cell.

43. The reading method according to claim 42 wherein the additional voltage produces a potential difference between the first column line and the third column line to substantially eliminate a current between the first column line and the third column line.

44. The method according to claim 43 wherein the additional voltage is substantially equal to the first reading voltage.

* * * * *

UNITED STATES PATENT AND TRADEMARK OFFICE
CERTIFICATE OF CORRECTION

PATENT NO.   : 6,594,180 B2
DATED        : July 15, 2003
INVENTOR(S)  : Pascucci It is certified that error appears in the above-identified patent and that said Letters Patent is hereby corrected as shown below:

<u>Title page,</u>
Item [75], delete "Milan (IT)" insert -- Sesto San Giovanni, Milano (IT) --

<u>Column 13,</u>
Line 57, delete "pG1" insert -- PG1 --
Line 67, insert -- in -- between "used" and "FIG. 6,"

<u>Column 14,</u>
Line 28, insert -- a -- between "in" and "similar"

<u>Column 16,</u>
Line 60, delete "V-BL1s" insert -- V-BL is --

Signed and Sealed this

Ninth Day of December, 2003

JAMES E. ROGAN
*Director of the United States Patent and Trademark Office*